United States Patent
Bijlenga et al.

[11] Patent Number: 5,920,472
[45] Date of Patent: Jul. 6, 1999

[54] HIGH VOLTAGE CONVERTER CIRCUIT

[75] Inventors: Bo Bijlenga, Skultuna; Lennart Zdansky; Anders Persson, both of Västerås, all of Sweden

[73] Assignee: Asea Brown Boveri AB, Vasteras, Sweden

[21] Appl. No.: 08/921,087

[22] Filed: Aug. 29, 1997

[30] Foreign Application Priority Data

Mar. 24, 1997 [SE] Sweden .................................. 9701070

[51] Int. Cl.$^6$ ........................ H02M 3/24; H02M 7/5387; G05F 1/40
[52] U.S. Cl. .......................... 363/97; 363/132; 323/282; 323/279
[58] Field of Search ................................ 363/97, 98, 132, 363/96; 323/266, 268, 272, 284, 279, 282

[56] References Cited

U.S. PATENT DOCUMENTS

| | | | |
|---|---|---|---|
| 4,941,079 | 7/1990 | Ooi ........................................... | 363/132 |
| 5,027,264 | 6/1991 | DeDoncker et al. ..................... | 363/16 |
| 5,661,644 | 8/1997 | Bergman et al. ......................... | 363/56 |
| 5,675,244 | 10/1997 | Piton ....................................... | 323/901 |
| 5,691,632 | 11/1997 | Otake ...................................... | 323/282 |
| 5,698,970 | 12/1997 | Stanojevic ............................... | 323/223 |

FOREIGN PATENT DOCUMENTS

| | | |
|---|---|---|
| 0 031 083 A1 | 7/1981 | European Pat. Off. . |
| 0 654 885 A1 | 5/1995 | European Pat. Off. . |

*Primary Examiner*—Robert E. Nappi
*Assistant Examiner*—Rajnikant B. Patel
*Attorney, Agent, or Firm*—Pollock, Vande Sande & Amernick

[57] ABSTRACT

A power supply apparatus for a drive unit in a high voltage converter circuit, the circuit has a plurality of power semiconductors connected in series. Each power semiconductor is connected to a drive unit for turning the power semiconductor on and off. The power supply apparatus consists of a capacitor and a regulator connected in parallel with the power semiconductor. The capacitor is connected to the drive unit and stores sufficient energy for power supply of the drive unit. The regulator regulates the voltage across the capacitor.

23 Claims, 5 Drawing Sheets

HIGH VOLTAGE CONVERTER CIRCUIT

FIELD OF THE INVENTION

The present invention relates to a high voltage converter circuit comprising a plurality of power semiconductor devices of turn-off type connected in series. The invention includes for each power semiconductor device a drive unit connected to the gate thereof and adapted to control the power semiconductor device to be turned on and turned off, as well as an apparatus for power supply of the drive unit.

BACKGROUND OF THE INVENTION

A "converter circuit" is defined as a circuit which is part of a device for converting high voltage, which converts direct voltage to alternating voltage or the converse, or converts direct voltage to direct voltage upward or downward with respect to the input voltage level or alternating voltage to alternating voltage upwardly or downwardly from one frequency to another.

Such circuits may, for example, be used in voltage source converters for transmission of electric power through High Voltage Direct Current (HVDC) for conversion of direct voltage to alternating voltage and conversely. Plants for reactive power compensation (RPC) may also utilize such converters. These converters may in such plants typically have to maintain voltages within the range of 10–500 kV, although other voltages are conceivable. This makes it necessary to connect many power semiconductor devices in series to distribute the voltage among them, since they normally each may only hold 1–5 kV.

Examples of such power semiconductor devices of turn-off type are gate turn-off thyristors (GTO), MOSFETs and IGBTs (Insulated Gate Bipolar Transistors), of which the latter are preferable since they combine good power handling ability with features making them suited for connection in series in so-called IGBT valves in converters, since they may easily be turned on and turned off simultaneously.

When using many power semiconductor devices connected in series in a high voltage converter circuit of the type defined in the introduction, there is a problem in supplying the individual drive units with energy. A possible solution is to provide the different drive units with energy from, for example, ground potential while utilizing individual transformers, one for each drive unit. This solution is very expensive, especially in high voltage converter circuits in which the potential differences between ground and the different drive units is high, such as, for example, tens of kV or more.

SUMMARY OF THE INVENTION

The object of the present invention is to provide a high voltage converter circuit of the type defined in the introduction, in which an apparatus for power supply of the drive units is simpler and considerably less expensive than the alternatives described above and still is very reliable.

This object, according to the invention, is obtained by providing a high voltage converter circuit of the type defined in the introduction, in which the power supply apparatus comprises a first capacitor and a regulator adapted to regulate the voltage across the capacitor. The capacitor and regulator are connected in parallel with the power semiconductor device. The capacitor is adapted to store sufficient electric energy for the power supply of the drive unit when the power semiconductor device is conducting and the capacitor is connected to the drive unit associated with the power semiconductor device for power supply thereof.

The first capacitor is able to provide the drive unit with electric energy having the voltage required thereby due to the fact that the regulator ensures that the voltage across the capacitor is maintained at a desired level. The advantage of this type of power supply apparatus is that there is no need for any conventional power supply apparatus utilizing high voltage insulated transformers. This results in a saving in costs. Furthermore, the physical size of the apparatus is small. Also, the stray capacitance between the drive unit and ground is low, which is an important advantage in high voltage converter circuits in which very high voltage time differential coefficients will appear between the drive unit and ground during switching events, which may cause severe EMC problems.

According to a preferred embodiment of the invention, the regulator is a shunt regulator connected in parallel with the first capacitor, and the power supply apparatus comprises a static voltage divider connected in parallel with the power semiconductor device and having at least a first resistor connected in series with the parallel connection of the shunt regulator and the first capacitor. The use of such a shunt regulator as the regulator makes it possible to ensure that the drive unit is provided with a voltage not exceeding a given limit voltage at low cost. A shunt regulator is defined in a conventional way as a device designed to ensure that the voltage thereacross, and in this case also across the first capacitor, will not exceed a determined level, and to let the excess current through. A zener diode may, for example, be used as a shunt regulator, which constitutes another preferred and economically attractive embodiment of the invention.

According to another preferred embodiment of the invention, the regulator is a series regulator connected in series with the capacitor. A series regulator is defined in a conventional way as a device having a variable resistance adapted to regulate the current therethrough so that the voltage across the first capacitor is kept substantially constant. It is a disadvantage to use a series regulator instead of a shunt regulator as this will be considerably more expensive, since it requires a high voltage switch. But it has an advantage in the case where voltages across the power semiconductor device vary greatly, since it would be necessary in the case of a shunt regulator to have the resistor mentioned be of very low ohmic resistance so as to obtain sufficient power supply at low voltages, which results in unreasonably high power losses in the resistor at high voltages.

According to another preferred embodiment of the invention, the apparatus comprises a DC/DC converter, the input of which is connected to the first capacitor and the outputs of which are connected to the drive unit and adapted to provide the latter with an optional positive and negative voltage. An arrangement of such a converter between the first capacitor and the drive unit is a necessity when the power semiconductor device to be controlled requires a negative voltage to be applied to the gate thereof, which is the case for many power semiconductor devices. Furthermore, the efficiency of the power supply apparatus may be raised, due to the fact that the input voltage of the DC/DC converter is substantially higher than the output voltage, which results in lower power losses in the resistor and the shunt regulator.

According to another preferred embodiment of the invention, the DC/DC converter is dimensioned to have at the input thereof voltages having a substantially higher level than required by the drive unit, so that the current consumption from the first capacitor is substantially lower than the total power consumption of the drive unit. This makes it possible to use the converter to obtain exactly the voltage level demanded by the drive unit without the need for the regulator to ensure that the voltage across the first capacitor is kept at a low level, whereby the power losses in the apparatus are kept low.

According to another preferred embodiment of the invention, a capacitor is connected across each of the outputs of the DC/DC converter to store electric energy. The drive unit may be provided continuously with exactly the voltage required for the moment by tapping voltage across suitable terminals of the capacitors.

According to another preferred embodiment of the circuit provided with a shunt regulator, a second resistor is connected in parallel with the shunt regulator and is adapted to obtain a voltage division through the static voltage divider at blocking voltages across the power semiconductor device lower than the limit voltage of the shunt regulator. A good voltage division of the apparatus of each power semiconductor device is ensured independently of any varying leakage current characteristics between the different power semiconductor devices at low voltages. The same result may also be obtained by resistors included in the shunt regulator.

According to another preferred embodiment of the invention, the circuit comprises a first diode connected between the terminals of the regulator, and the first capacitor is located upstream with respect to the conducting direction of the power semiconductor device. The diode has a conducting direction towards the first capacitor so as to prevent this capacitor from being discharged other than by the drive unit. This is advantageous for permanently ensuring the power supply of the drive unit.

According to another preferred embodiment of the invention, the apparatus in the embodiment mentioned above having a regulator in the form of a shunt regulator comprises a fourth capacitor connected in parallel with the series connection of the first resistor and the shunt regulator. The fourth capacitor is adapted to be charged when the power semiconductor device is blocked and to be discharged through the first resistor in order to charge the first capacitor with electric energy when the power semiconductor device is turned on. This allows charging and energy storing in the first capacitor continuously, both at a blocked power semiconductor device and at a turned on one, which makes the power supply of the drive unit very reliable.

According to another preferred embodiment of the invention, which constitutes a further development of the embodiment mentioned above having a regulator in the form of a series regulator, the apparatus comprises a fourth capacitor connected in parallel with the series connection of the series regulator and the first capacitor. The fourth capacitor is adapted to be charged when the power semiconductor device is blocked and to be discharged through the series regulator and by that discharge, will charge the first capacitor with electric energy when the power semiconductor device is turned on. The advantages of this embodiment are the same as in the embodiment described above.

According to another preferred embodiment of the invention, a second diode is connected in series with the fourth capacitor and the regulator and prevents the fourth capacitor from being discharged by the power semiconductor device. It is by this series connected diode obtained that the energy stored in the fourth capacitor is prevented from being discharged through the power semiconductor device during the conducting state of the semiconductor device.

According to another preferred embodiment, which constitutes a further development of the embodiment mentioned above having a regulator in the form of a shunt regulator, the first resistor has a controllable resistance. Thus, the first resistor is formed by a series regulator. The advantage of this is that the resistance of the resistor may be controlled according to the prevailing conditions so as to keep the power losses low and to ensure a safe power supply of the drive unit. The resistance of the first resistor may, for example, be reduced should it be necessary to tap the power required for the drive unit at a low voltage over the power semiconductor device. Should the voltage over a fourth capacitor be too high, as a consequence of a large spreading of the characteristics of the different power semiconductor devices of the circuit, the resistance of the first resistor may then be reduced so as to reduce the voltage over the first capacitor. These two possibilities are objects of other preferred embodiments of the invention.

According to another preferred embodiment of the invention a first resistor is formed by a parallel connection of a fixed resistor and a branch being controllable to control the resistance of the first resistor. This is an advantageous way to control the first resistor, since it will then be possible to reduce the resistance of the first resistor starting from the highest possible resistance exhibited by the resistor included therein and preferably being the most suitable resistance under normal circumstances.

According to another preferred embodiment of the invention, which constitutes a further development of the embodiment last mentioned, the branch has a resistor with a resistance substantially lower than the resistance of the fixed resistor and a transistor switch connected in series therewith. The transistor may be a bipolar transistor, a MOSFET, or an IGBT. By this, it will be possible to change between two values of the resistance of the first resistor which differ substantially according to prevailing conditions According to another preferred embodiment of the invention, which constitutes a further development of the embodiment having a first resistor in the form of a controllable resistance, the first resistor is formed by a series connection of a fixed resistor and another resistor, as well as a branch connected in parallel with the latter resistor, and a transistor switch is arranged to be controllable to alternatively short-circuit this resistor to form the controllable resistance substantially by the resistance of the fixed resistor and disconnect the branch for making the controllable resistance to the sum of the resistances of both these resistors. It is by this obtained that the controllable resistance is always larger than the resistance of the fixed resistor and that the voltage across the transistor switch is not too high.

Further advantages and advantageous features of the invention appear from the following description and the other dependent claims.

BRIEF DESCRIPTION OF THE DRAWINGS

With reference to the appended drawings, below follows a description of preferred embodiments of the invention cited as examples. In the drawings.

DETAILED DESCRIPTION OF THE INVENTION

Figure 1:
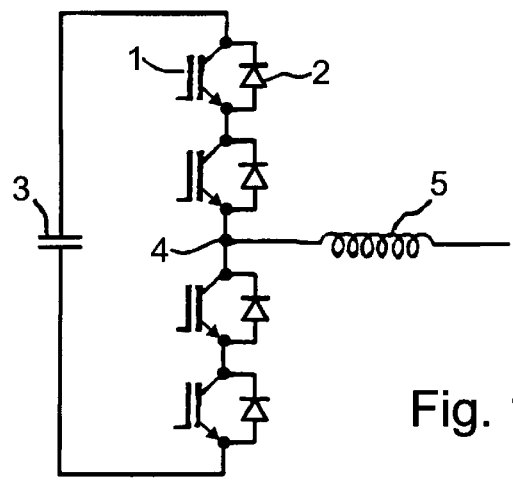
FIG. 1 is a simplified diagram of a high voltage converter circuit, to which the invention is applicable.

A phase leg of a high voltage converter circuit, to which the present invention is applicable, is schematically shown in FIG. 1. There are normally three phase legs, having a direct current capacitor 3 in common, in a plant connected to a three-phase alternating current network. The circuit comprises in a conventional way a plurality of power semiconductor devices 1 connected in series, here in the form of IGBTs, and a so-called free-wheeling diode 2 connected in anti-parallel with each such IGBT. The number of power semiconductor devices connected in series would, in practice, be considerably larger than indicated in FIG. 1. The series connection of the power semiconductor devices is connected to a direct voltage capacitor 3, while the phase terminal 4 between the power semiconductor devices is connected through a phase reactor 5 to, for example, a phase of an alternating current network. The power semiconductor devices with the diodes arranged in FIG. 1 above the phase terminal 4 form an IGBT valve and those located thereunder form another IGBT valve. All the power semiconductor devices in an IGBT valve are turned on simultaneously through signals from a drive unit 6 each schematically indicated in FIG. 3, so that the power semiconductor devices in the first IGBT valve are conducting when a positive potential is desired at the phase terminal 4 and the power semiconductor devices in the second IGBT valve are conducting when a negative potential is desired on the phase terminal 4. By controlling the power semiconductor device according to a determined pulse width modulation pattern (PWM), the direct voltage across the direct voltage capacitor 3 may be used for generating a voltage at the phase terminal 4, the fundamental component of which is an alternating voltage having a desired amplitude, frequency and phase position.

Figure 2:
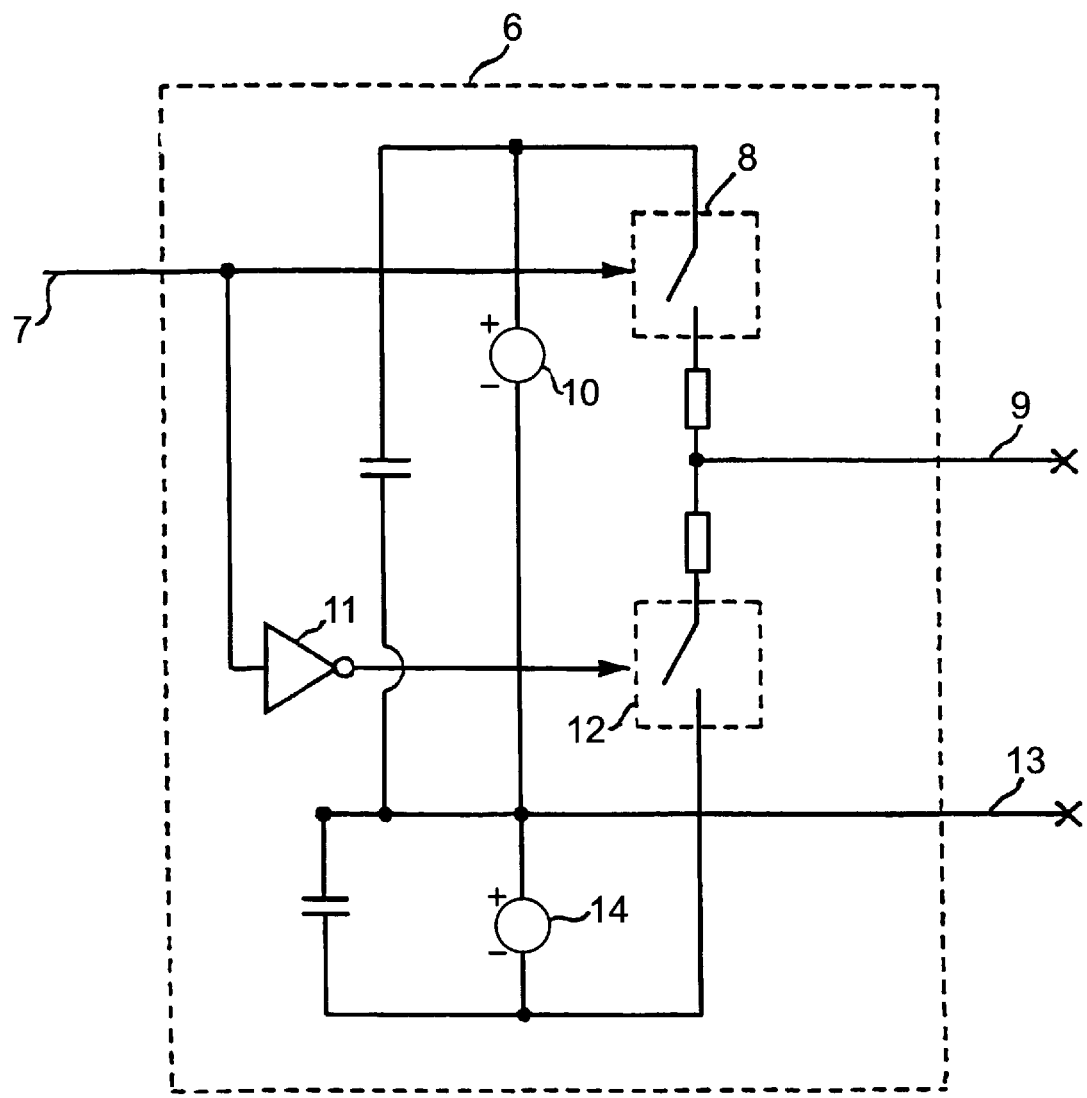
FIG. 2 is a view illustrating a possible structure of a drive unit for controlling the respective power semiconductor device in a high voltage converter circuit.

It is illustrated in FIG. 2 how a drive unit for driving an individual power semiconductor device may be structured. Each drive unit within an IGBT valve receives a control signal simultaneously, preferably through fiber optic means, for obtaining and galvanic insulation and to keep the stray capacitance between the power semiconductor device and ground low, at an input 7 from a control apparatus adapted to send control signals according to a desired pattern. It may be arranged that upon a logical one at the input 7, a switch 8 is controlled to connect the gate 9 of the IGBT to the positive terminal of a voltage source 10, while an inverter 11 ensures that a second switch 12 receives a logical zero, thereby opening it. The gate 9 will then receive a positive voltage with respect to the emitter 13. The power semiconductor device is thereby turned on. In turning the power semiconductor off, a logical zero is sent to the input 7, which opens switch 8 and closes switch 12, so that the gate 9 receives a negative voltage and the IGBT is turned off. This is conventional technique.

Figure 3:
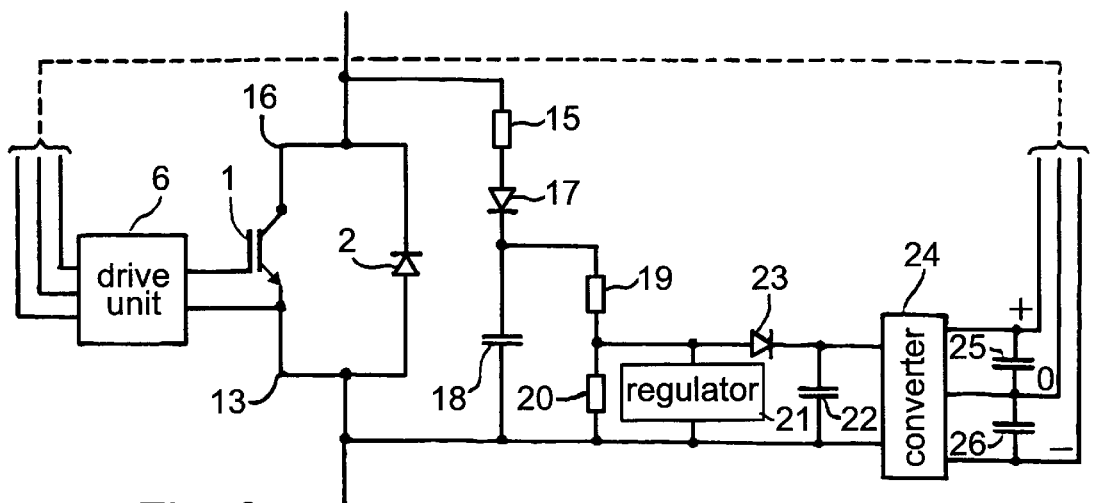
FIG. 3 is a diagram illustrating the structure of the power supply of a drive unit for a power semiconductor device in a high voltage converter circuit according to a first preferred embodiment of the invention.

It is shown in FIG. 3 how, in a conventional way, a first resistor 15 is connected in series with a second diode 17 and a fourth capacitor 18 is connected between the collector 16 and the emitter 13 of the power semiconductor device in parallel with the power semiconductor device. A first resistor 19 is connected in parallel with the fourth capacitor. The components described so far constitute a type of static and dynamic voltage divider for power semiconductor devices connected in series, in which the first resistor 19 is then directly connected to the two terminals of the capacitor. This constitutes a voltage-dividing circuit with the diode 17 as clamping diode, the resistor 15 as current-limiting resistor, the capacitor 18 as clamping capacitor, and the resistor 19 as a voltage-diving resistor. The diode 17 and the capacitor 18 are used for dynamic voltage division in switches to smooth out voltage differences between different IGBTs, which result as a consequence of the spread of the tail current charge when the IGBTs are turned off and the spread in reverse recovery charge when the diode 2 is turned off. The resistor 19 is needed both for static voltage division to smooth out the voltage differences between different IGBTs as a consequence of a spread in leakage current, and for dynamic voltage division to achieve discharging of the capacitor 18 with a time constant T being identical to the resistance of the resistor 19 multiplied by the capacitance of the capacitor 18. This constitutes prior art, and the characterizing features of the invention will now be explained.

A parallel connection of a second resistor 20, a shunt regulator 21, such as a zener diode, and a first capacitor 22 are connected in series with the first resistor 19. Between the shunt regulator 21 and the terminal of the first capacitor connected to the mid point between the resistors 19 and 20, a first diode 23 is connected with the conducting direction towards the first capacitor. The terminals of the first capacitor 22 are connected to the input of a DC/DC converter 24, which has a second 25 and a third 26 capacitor each connected across an output thereof, wherein the + and 0 constitute one output and − and 0 another. The terminals of these two capacitors 25, 26 are connected to the drive unit 6 of the respective power semiconductor device so as to constitute the voltage sources 10 and 14.

The function of this circuit is as follows. When the power semiconductor device blocks, the shunt regulator 21 will ensure that the voltage over the capacitor only increases to a limit voltage of, for example, 300 V, and the first capacitor 22 will be charged and store electric energy upon blocking. Also, the fourth capacitor 18 will be charged. Upon turning on of the power semiconductor device, the fourth capacitor 18 will be discharged through the first resistor 19 and, in this way, contribute to keeping the first capacitor 22 charged. Discharging of the fourth capacitor 18 other than through the first resistor 19 is prevented through the diode 17, while the diode 23 prevents discharging of the first capacitor 22 other than through the DC/DC converter. The DC/DC converter is in this way provided at its input with the direct voltage applied across the first capacitor 22, which it converts to a lower direct voltage at its output so that, for example +15 V is obtained at one terminal of the second capacitor 25, 0 V between the terminals of the capacitors, and −15 V at the other terminal of the third capacitor 26. The capacitors 25, 26 store this energy which they may supply to the drive unit 6 when it is called for by a control signal 7 at the input thereof. The terminals of these capacitors may form the voltage source symbols 10 and 14 in FIG. 2. Through the arrangement of the second resistor 20, a good voltage division across the power semiconductor device is ensured at low voltages below the limit voltage of the shunt regulator, which otherwise would result in an irregular voltage distribution among such power semiconductor units connected in series wherein the semiconductor devices have differences with respect to leakage current.

Figure 4:
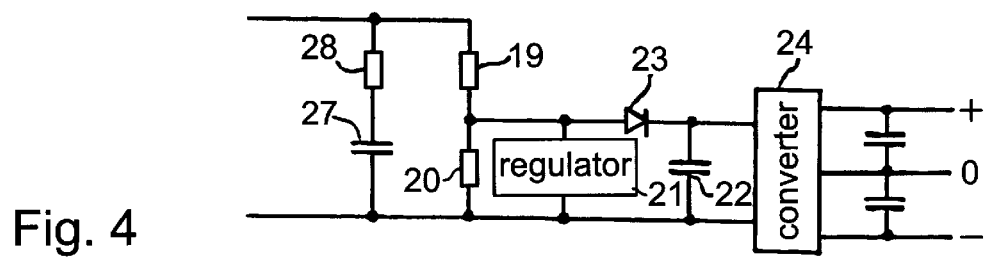
FIG. 4 is a diagram of the power supply for a drive unit for a power semiconductor device in a high voltage converter circuit according to a second preferred embodiment of the invention.

A part of a high voltage converter circuit according to a second preferred embodiment of the invention is shown in FIG. 4, which differs from that shown in FIG. 3 in that the third resistor 15 and the second diode 17 are omitted, and the second capacitor is replaced by a dynamic voltage divider in the form of a capacitor 27 connected in series with a resistor 28. The first resistor 19, the second resistor 20, and the shunt regulator 21 here function as a static voltage divider. The first capacitor 22 will, in this embodiment, only be charged when a high voltage is applied across the power semiconductor device, i.e., when it is in the blocking state. This means that the voltage across the first capacitor 22 will decrease below the limit voltage of the shunt regulator when the power semiconductor device is turned-on, which makes it important that the capacitor 22 is made sufficiently large with respect to the switching frequency of the power semiconductor device so that the voltage across the terminals thereof does not sink below the level demanded by the DC/DC converter in order to provide the drive unit with sufficient voltage and current for the proper function thereof.

Figure 5:
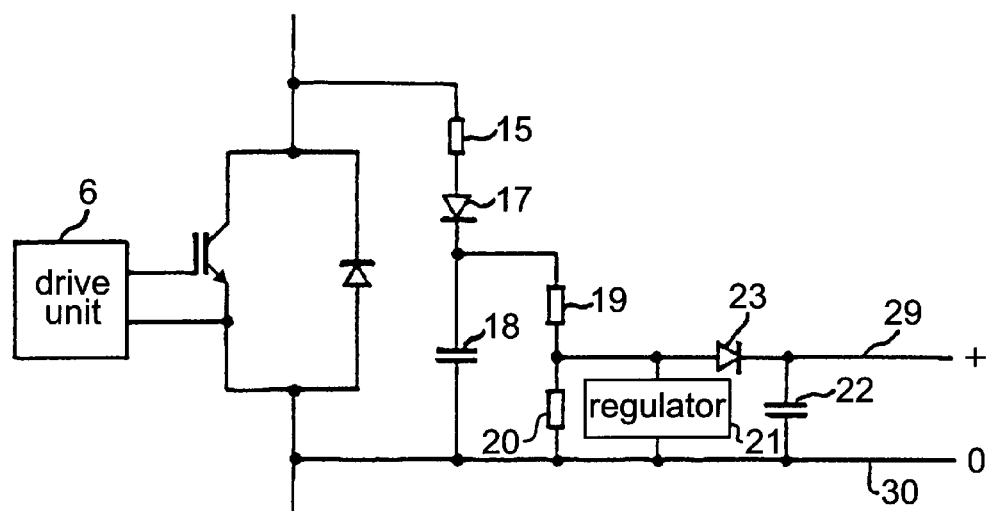
FIG. 5 is a diagram of the power supply for a drive unit for a power semiconductor device in a high voltage converter circuit according to a third preferred embodiment of the invention.

A part of a high voltage converter circuit according to a third preferred embodiment of the invention is schematically illustrated in FIG. 5, which only differs from that shown in FIG. 3 in that the DC/DC converter 24 and the capacitors 25 and 26 connected thereto have been omitted and the terminals 29, 30 of the first capacitor 22 are connected directly to the drive unit for power supply thereof. This embodiment can be used in the case where it is not necessary to provide both negative and positive voltages to the gate of the power semiconductor device, and the limit voltage of the shunt regulator may be matched to the desired voltage for the power supply of the drive unit.

Figure 6:
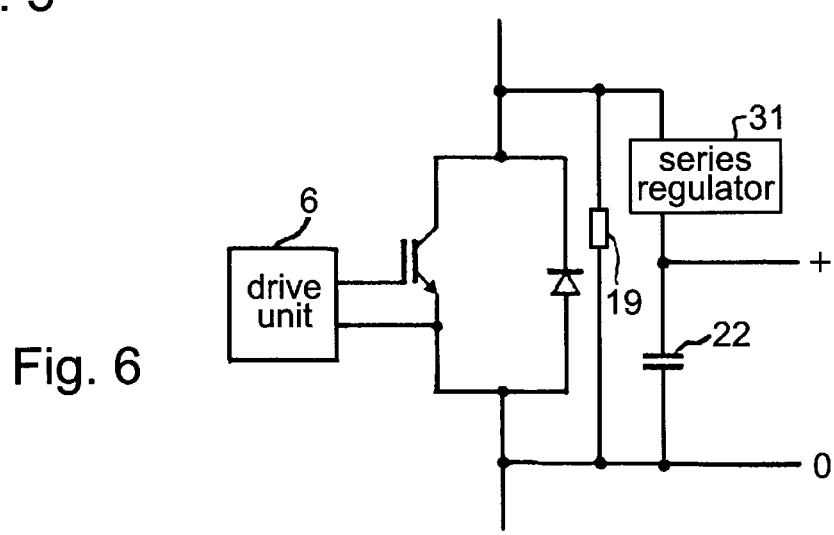
FIG. 6 is a diagram of the power supply for a drive unit for a power semiconductor device in a high voltage converter circuit according to a fourth preferred embodiment of the invention.

The power supply for a drive unit for a high voltage converter circuit according to a fourth, very simplified, embodiment of the invention is illustrated in FIG. 6, in which a series regulator 31 is connected in series with a first capacitor 22. These are connected in parallel with the power semiconductor device between the collector and the emitter thereof, the terminals of the first capacitor are connected to a drive unit 6 for a power supply. The series regulator 31 functions in principle as a variable resistor and regulates the current therethrough, so that the voltage across the capacitor 22 is kept constant. When the power semiconductor device is in the blocking state, the capacitor 22 will be charged to a desired voltage. Also, a static voltage divider with a first resistor 19 is connected in parallel with each power semiconductor device. This embodiment may of course be supplemented by components according to other embodiments of the invention, such as a fourth capacitor, a DC/DC converter and so on, in which the main difference here is that it is a series regulator 31 that ensures a maximum voltage level across the terminals of the first capacitor, while this is ensured through a shunt regulator in the first three embodiments.

Although the power supply circuits according to the embodiments described so far function well, the losses of the voltage divider formed by the first resistor and the series connection thereof with the second resistor, and a shunt regulator, may in some applications be very high. This is especially true when the drive unit has to be provided with power at very low direct voltages across the power semiconductor device and if the voltage divider has to account for a large spread in leakage current as a consequence of a large spread of static and dynamic characteristics of the different power semiconductor devices. It is in both of these cases important that the first resistor have a very low resistance; which would result in high power generation in this resistor when high voltages occur. Therefore, the first resistor has been provided with a variable resistance, i.e., it has, in practice, been replaced by a series regulator, so as to remedy this problem. In the embodiment shown in FIG. 7, this has been achieved by connecting a resistor 19' in parallel with a series connection of an additional resistor 32 having a substantially lower resistance than the resistor 19 and a transistor switch 33, which is controllable by a means 34. The means 34 may, for example, react upon voltages across the fourth capacitor 18 and be closed when this voltage exceeds a predetermined value to reduce the resistance across the two terminals of the resistor 19' and reduce the voltage across the capacitor. The control means 34 may, as an alternative, react upon a decrease of the voltage across the first capacitor 22 below a determined value and then close the transistor switch 33 to be able to deliver sufficient voltage to the DC/DC converter. It should be noted that the transistor switch 33 should be of a normally on type to make the DC/DC converter start.

Figure 7:
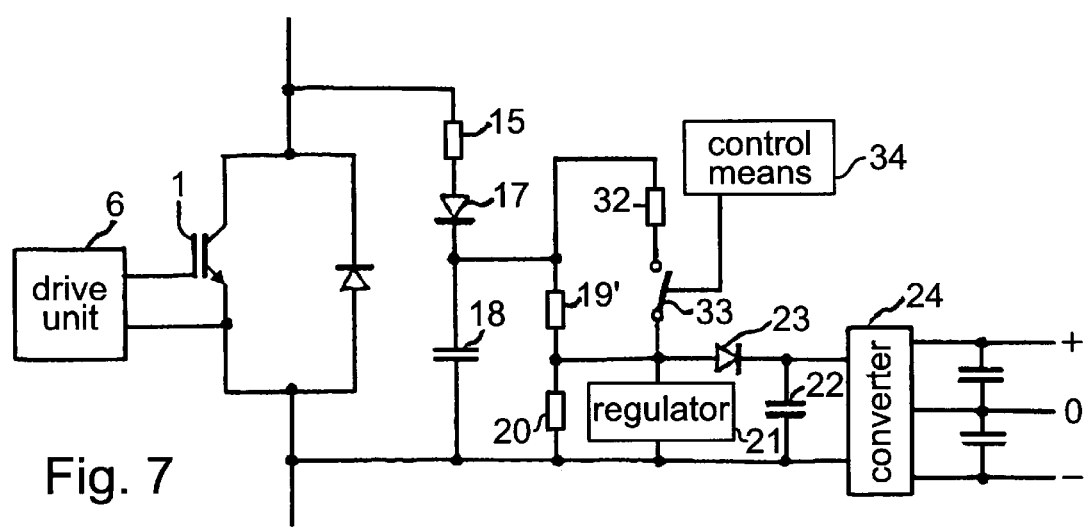
FIG. 7 is a diagram of the power supply for a drive unit for a power semiconductor device in a high voltage converter circuit according to a fifth preferred embodiment of the invention.
Figure 8:
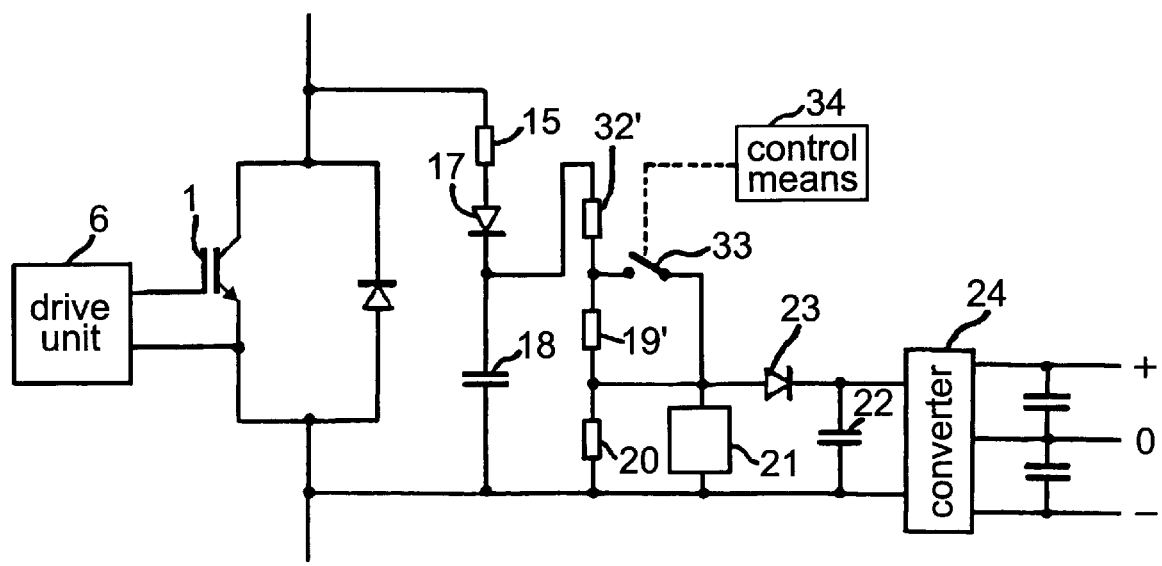
FIG. 8 is a diagram of the power supply for a drive unit for a power semiconductor device in a high voltage converter circuit according to a sixth preferred embodiment of the invention.

A circuit according to another embodiment is shown in FIG. 8, this differs from the embodiment shown in FIG. 7 in that the controllable resistance of the first resistor here is formed by a series connection of a fixed resistor 32' and another resistor 19'. A branch is connected in parallel with the latter resistor and has a transistor switch 33 controllable through the means 34 to alternatively short-circuit this resistor 19' to form the controllable resistance substantially from the resistance of the fixed resistor and to interrupt the branch to make the controllable resistance equal the sum of the resistances of the two resistors 19', 32'. The result of this is that the controllable resistance will never be lower than the resistance of the fixed resistor 32', and the voltage across the transistor switch 33 may never be as high as in the embodiment according to FIG. 7.

Figure 9:
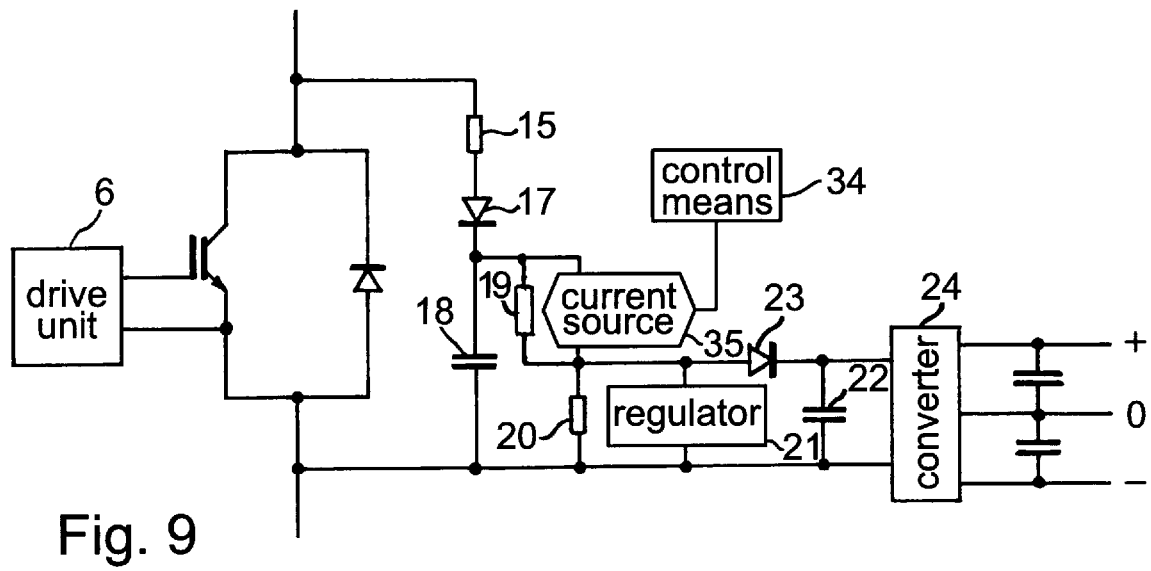
FIG. 9 is a diagram of the power supply for a drive unit for a power semiconductor device in a high voltage converter circuit according to a seventh preferred embodiment of the invention.

The embodiment according to FIG. 9 differs from that according to FIG. 7 in that the series connection of the resistor 32 and the transistor switch 33 has been replaced by a variable current source 35. This is intended to be controlled according to the same principles as the transistor switch 33 in FIG. 7.

Figure 10:
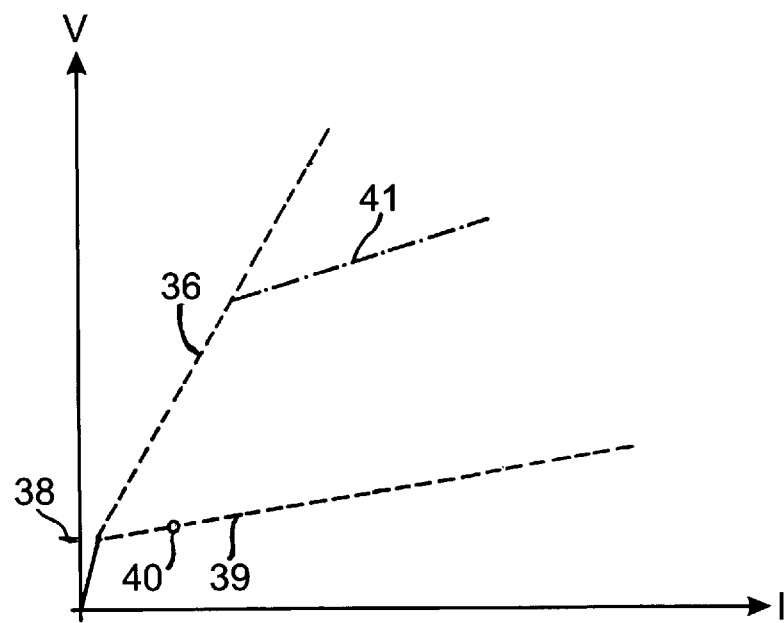
FIG. 10 is a graph illustrating how the voltage across the fourth capacitor of the power supply for a drive unit in the high voltage converter circuits according to FIGS. 7, 8 and 9 may depend upon the current through the first resistor.

Finally, the graph in FIG. 10 illustrates, by plotting the voltage V across the fourth capacitor 18 as a function of the current I through the voltage divider, how the embodiments according to FIGS. 7, 8 and 9 may be used to obtain better IV characteristics. The development for maximum total resistance of the connection in question for a controllable resistance is shown by the dashed line 36. The limit voltage 38 of the shunt regulator is also indicated. It is shown by line 39 how the resistance of the first resistor may be regulated to a lower level at a low voltage across the power semiconductor device so that the DC/DC converter may still be started. However, when the voltage across the power semiconductor device is higher, the transistor switch 33 is opened and line 36 is followed. At even higher voltages, it may be advantageous to have a low differential resistance to improve the voltage distribution among the power semiconductor devices connected in series. The transistor switch 33 may then be controlled according to a suitable PWM method so that the average of the current discharging the capacitor 18 may be brought to resemble, for example, the line 41. The advantage of this is that a low differential resistance is obtained at a high voltage across the power semiconductor device without making the power consumption in the static voltage divider unnecessarily high.

The invention is, of course, not in any way restricted to the preferred embodiments described above, but a plurality of modifications thereof will be apparent to one skilled in the art without departing from the basic idea of the invention, as defined in the claims.

Additional components may for example be added to the preferred embodiments shown in the figures and some of them may be removed, such as, for example, the second resistor, and the circuits may still function under certain conditions.

We claim:

1. A power supply apparatus for a drive unit in a high voltage converter circuit, said circuit having a plurality of power semiconductors of a turn-off type connected in series, each said power semiconductor connected to a respective drive unit for turning said power semiconductor on and off, said power supply apparatus comprising:
    a first capacitor and regulator connected in parallel with each said power semiconductor, said first capacitor being adapted to store sufficient electric energy for the power supply of said drive unit when said power semiconductor is conducting, said regulator being adapted to control a voltage across said first capacitor; and
    a DC/DC converter connected at its input to said first capacitor and at its outputs to said drive unit, whereby said DC/DC converter provides said drive unit with optional positive and negative voltages.

2. The apparatus according to claim 1 further comprising,
    a static voltage divider connected in parallel with said power semiconductor, wherein said regulator is a shunt regulator connected in parallel with said first capacitor; and
    at least a first resistor is connected in series with the parallel connection of said shunt regulator and said first capacitor.

3. The apparatus according to claim 1 wherein said regulator is a series regulator connected in series with said first capacitor.

4. The apparatus according to claim 1 wherein said DC/DC converter is dimensioned to have voltages at its input which are substantially higher than voltages required by said drive unit whereby current consumption from said first capacitor is substantially lower than total current consumption of said drive unit.

5. The apparatus according to claim 1 further comprising a capacitor connected across each output of said DC/DC converter.

6. The apparatus according to claim 1 wherein at least one of said outputs of said DC/DC converter supplies a negative voltage with respect to a cathode of said power semiconductor.

7. The apparatus according to claim 2 further comprising a second resistor connected in parallel with said shunt regulator, whereby acceptable voltage division is obtained at voltage across said power semiconductor which are lower that the limit voltage of said shunt regulator.

8. The apparatus according to claim 1 further comprising a first diode connected between said regulator and said first capacitor, said first diode having a conducting direction towards said first capacitor whereby it prevents the discharge of said first capacitor except by said drive unit.

9. The apparatus according to claim 2 further comprising a fourth capacitor connected in parallel with the series connection of said first resistor and said shunt regulator, said fourth capacitor being adapted to be charged when said power semiconductor is blocked and discharged through said first resistor when said power semiconductor is turned on, whereby said discharge charges said first capacitor.

10. The apparatus according to claim 3 further comprising a fourth capacitor connected in parallel with the series connection of said first resistor and said shunt regulator, said fourth capacitor being adapted to be charged when said power semiconductor is blocked and discharged through said first resistor when said power semiconductor is turned on, whereby said discharge charges said first capacitor.

11. The apparatus according to claim 9 further comprising a second diode connected in series with said fourth capacitor and said shunt regulator, whereby said fourth capacitor is prevented from being discharged by said power semiconductor.

12. The apparatus according to claim 11 further comprising a third resistor connected in series with said second diode.

13. The apparatus according to claim 2 wherein said shunt regulator is a zener diode.

14. The apparatus according to claim 2 wherein said first resistor has a controllable resistance.

15. The apparatus according to claim 14 wherein said first resistor comprises a fixed resistor connected in parallel with a means for controlling the resistance of said first resistor.

16. The apparatus according to claim 15 wherein said means for controlling comprises a resistor, having a resistance substantially lower than the resistance of said fixed resistor, connected in series with a transistor switch.

17. The apparatus according to claim 14 wherein said first resistor comprises,
    a fixed resistor connected in series with a third resistor;
    a branch connected in parallel with said third resistor, said branch having a transistor switch arranged to alternately short-circuit said third resistor and disconnect said branch, whereby said controllable resistance is alternately, substantially a resistance of said fixed resistor or a sum of the resistance of said fixed resistor and said third resistor, respectively.

18. The apparatus according to claim 15 wherein said means for controlling includes a controllable current source.

19. The apparatus according to claim 14 further comprising means for controlling said resistance of said first resistor to be lower at a blocking voltage of said power semiconductor which is lower than a pre-determined value than at a blocking voltage which exceeds said pre-determined value.

20. The apparatus according to claim 9 wherein said first resistor has a controllable resistance.

21. The apparatus according to claim 20 further comprising means for controlling said resistance of said first resistor to be lower at a voltage across said fourth capacitor which exceeds a pre-determined value than at a voltage lower than said pre-determined value.

22. The apparatus according to claim 1 wherein voltages in the order of tens of volts are delivered to said drive unit.

23. The apparatus according to claim 1 wherein said power semiconductors each block voltages exceeding 1 KV.

* * * * *